(12) United States Patent
Lin

(10) Patent No.: US 7,931,969 B2
(45) Date of Patent: Apr. 26, 2011

(54) MOLECULAR FAN

(75) Inventor: Chhiu-Tsu Lin, Sycamore, IL (US)

(73) Assignee: Northern Illinois University, DeKalb, IL (US)

( * ) Notice: Subject to any disclaimer, the term of this patent is extended or adjusted under 35 U.S.C. 154(b) by 958 days.

(21) Appl. No.: 11/331,492

(22) Filed: Jan. 13, 2006

(65) Prior Publication Data

US 2007/0166551 A1 Jul. 19, 2007

(51) Int. Cl.
*B32B 27/00* (2006.01)
*B32B 27/40* (2006.01)
(52) U.S. Cl. .................. 428/411.1; 428/423.1; 428/500
(58) Field of Classification Search ............... 428/411.1, 428/423.1, 500
See application file for complete search history.

(56) References Cited

U.S. PATENT DOCUMENTS

| 6,649,090 B2 * | 11/2003 | Funaki et al. ........... 252/500 |
| 2003/0151030 A1 * | 8/2003 | Gurin ..................... 252/502 |
| 2004/0069454 A1 * | 4/2004 | Bonsignore et al. ..... 165/104.15 |

FOREIGN PATENT DOCUMENTS

JP 2004-071969 4/2004

OTHER PUBLICATIONS

Subramanian, Vaidyanathan et al., "Influence of Metal/Metal Ion Concentration on the Photocatalytic Activity of $TiO_2$-Au Composite Nanoparticles," http://pubs.acs.org/cgi-bin/article.cgi/langd5/2003/19/i02/html/1a026478t.html.

Mogyorosi, K. et al., "Preparation and Characterization of Clay Mineral Intercalated Titanium Dioxide Nanoparticles," http://pubs.acs.org/cgi-bin/article.cgi/langd5/2003/19/i07/html/1a025969a.html.

Chris Bower, et al., "Plasma-induced alignment of carbon nanotubes," *Applied Physics Letters*, vol. 77, No. 6 (2000).

Fan, J.R. et al., "A Two-Dimensional Mathematical Model of Liquid-Feed Direct Methanol Fuel Cells," http://pubs.acs.org/cgi-bin/article.cgi/enfuem/2002/16/i06/html/ef0102723.html.

Tan, F.L. et al. "Cooling of mobile electronic devices using phase change materials," http://www.sciencedirect.com/science?ob=ArticleURL&_udi=B6V1Y-49V78ND-1&_co... (Aug. 31, 2006).

Bessaih, R. et al. "Turbulent natural convection cooling of electronic components mounted on a vertical channel," http://www.sciencedirect.com/science?_ob=ArticleURL&_udi=B6V1Y-3XH38HW-3&c ... (Aug. 31, 2006).

Ruckenstein, Eli, "Transfer Coefficients in Complex Cases by Scaling the Transport Equations," http://pubs.acs.org/cgi-bin/article.cgi/iecred/2003/42/i12/html/ie020779g.html.

Chen, Yu-Chang, et al. "Local Heating in Nanoscale Conductors," http://pubs.acs.org/cgi-bin/article.cgi/nalefd/2003/3/i12/html/n10348544.html.

* cited by examiner

*Primary Examiner* — Thao T. Tran
(74) *Attorney, Agent, or Firm* — Kohn & Associates PLLC

(57) ABSTRACT

A molecular fan for dissipating heat, the fan having a chemically functionalized molecular fan thin film coating affixed to a surface in need of heat dissipation. A nanocoating for dissipating heat, the coating having a thin film coating affixed to a surface in need of heat dissipation. A molecular fan thin film coating affixed to a surface in need of heat dissipation for dissipating heat.

19 Claims, 9 Drawing Sheets

MOLECULAR FAN

BACKGROUND OF THE INVENTION

1. Field of the Invention

Generally, the present invention relates to heat dissipation nanocoating for electronic devices. More specifically, the present invention relates to a chemically functionalized molecular fan thin film coating for use as a heat dissipation device.

2. Description of the Related Art

Heat dissipation is a problem many electronic devices have to resolve. For instance, in personal computers, notebook computers, and the like, overheated environments affect the performance and reliability of these electronic devices. Many machine malfunctions can be traced to heat-dissipating problems. Heat generated by electronic devices and other equipment should be dissipated to enable efficient operation and to prevent damage to components. In some applications, a heat exchanger or heat sink may be used to effectuate the dissipation of heat. Forced convection may also be employed to enhance the performance of the heat exchanger.

There are three common mechanisms by which an object can release heat energy: conduction, convection, and radiation. In conduction, the heat is transferred within a substance. The best way to draw heat away from a component is conduction, as is done in the regular heat-sink and fan arrangement. This works especially well in substances such as metal, where the particles (metal atoms with mobile or delocalized electron sea) are not rigidly held in place, and the hotter, rapidly oscillating metal atoms transfer energy to cooler, slowly oscillating metal atoms by colliding with them. In convection, a hot region of a gas or liquid moves away from the source of heat. The hot fluid is replaced by cool fluid, which is then heated. This cyclical method of cooling is the common way for a modern machine to disperse heat.

A conventional personal computer has heat sinks attached to help draw heat away from processors and other components by conduction. Thermal conductive transfer tape, thermal conductive bonding agent, or a thermal conductive rubber sheet, is generally used to join the heat sink and the electronic parts. Mechanical fans are positioned near these heat sinks to draw the warm air away from the heat sink by convection. A modern PC has several fans (usually two or three) for this purpose.

The most convenient way to draw heat away from a component is conduction, as is done in the regular heat-sink-and-fan arrangement. However, when the heat is to be transferred to the surroundings and away from the computer, conduction is not the best solution. Radiation, the emission of energy as photons, is the best and most efficient way to transfer heat energy. Conduction of heat away from the component to the surface of the molecular fan thin film coating is still necessary whether by a heat sink or by simply molecular fan thin film coating the component itself.

There are several problems with the prior art arrangements. One is that more space is required to add more fans, because as the computer components become more powerful, they tend to release more heat and require more circulation to cool. Eventually the number of fans in the computer becomes cumbersome. Because of this, when the heat is to be transferred to the surroundings and away from the computer, convection is not the best solution. Another problem is present in miniaturization. As components, and therefore the computers and machines themselves, get smaller and smaller they will have less room for fans while concentrating heat production into a smaller area. This will result in a small center for a great deal of heat, and will require more efficient cooling. Using the presently available systems, eventually machines would have fans as their largest components. Mechanical fans also create their own heat when they convert magnetic potential into kinetic energy. This amount of heat is small, and is almost immediately dispersed by the action of the fan itself. With many fans in a small area, however, this heat can actually cause an increase in temperature over time, reducing the rate of cooling of heat sinks and components. Improving thermal performance of electronic components is very challenging due to the increasing power density and decreasing module sizes. The design trade off between electrical and mechanical characteristics and the cost of manufacturing products requires innovative solutions to improve the thermal performance of devices.

The primary cooling path in portable electronics serves to provide a low resistance path from the heat source to the system card and to spread the heat in its respective conductive layers. Numerous design techniques are implemented to achieve optimal thermal performance. However, conventional heat removal paths do not provide a sufficient thermal solution for small, mobile devices. Heat builds up in a local area and it is difficult for a small device to effectively dissipate the heat. Therefore, the use of heat pipe cooling systems in the electronic industry has been considered.

The cooling of mobile electronic devices such as personal digital assistants (PDAs) and wearable computers, has been studied by using a heat storage unit filled with the phase change materials (PCM) of n-eicosane inside the device. Desirable characteristics of a solid-liquid PCM include high heat of fusion per volume, congruent melting and freezing characteristics, high thermal conductivity, minimal supercooling, and low thermal expansion. Selecting a PCM for use in electronic cooling requires knowledge of the range of expected temperatures (the melt temperature of the PCM must be high enough such that melting does not occur until needed). Unfortunately just knowing the desired phase transition temperature is not sufficient to select a PCM. There are hundred of materials that melt in a temperature range useful for electronic cooling. However, the list of candidates becomes much smaller when issues such as material compatibility, toxicity (including environmental unfriendliness), availability of thermal property data, and cost are considered.

For example, in a computer system, the mother board has a central processing unit (CPU) for processing data operation. The CPU generates heat during operation and results in increasing temperature. When the temperature reaches a certain level, the CPU overheats and becomes unstable or even breaks down. The CPU is the main heat source of a computer system. To reduce the operation temperature of the CPU, a common practice is to install a heat sink on the CPU and place a fan on the heat sink so that the heat generated from the CPU is transmitted to the heat sink and the fan generates air flow to dissipate heat accumulated in the heat sink. In recent years, to meet the increasing demand of high-speed data processing, the manufacturing and design of CPUs have greatly improved. With improved performance and faster speed, operating voltages and frequencies for CPUs have also increased. Typically, a heat sink is arranged in close contact with a heat generating electronic component. As the power density of such components increases, heat transfer from the heat generating component to the surrounding environment becomes more and more critical to the proper operation of the component. Heat generated by the component is transferred to the heat sink and then dissipated from the heat sink to the surrounding air. One type of heat sink includes a metallic core in the form of a base plate. Heat dissipating fins extend from the base plate to increase the surface area of the heat sink. Heat transferred from the component to the base plate is spread throughout the base plate and to the fins fixed to the base plate. To further facilitate the dissipation of heat from the electronic component, a fan can be used to circulate air about outer surfaces of the fins and the base of the heat sink. As a result, the CPU operation temperature becomes much higher. To meet certain heat-dissipating requirements, it is necessary to enhance the heat-dissipating performance of fans.

In a conventional fan, the fan consists of a rotor and a stator. The stator is disposed in a frame of the fan and telescoped outside a bearing tube. The rotor has a shaft and a plurality of blades. The blades may generate airflow flowing toward the heat source. There is a pair of bearings disposed in the bearing tube to couple with the shaft. When the fan has increased its operational efficiency, operation temperature of the fan also increases (when the fan is energized, permanent magnets in the fan are excited by the stator and the rotor is driven to rotate and generate heat resulting from friction between the bearing and the shaft). The fan operating in high temperature environments tends to have a lower durability. Furthermore, bearings are prone to be damaged when operation temperature exceeds a certain level. Damaged bearings impact fan operation and also create noise.

As mentioned above, heat pipes have been used to dissipate heat. The heat pipe comprises a round shaped heat pipe and a flat shaped heat pipe. The flat heat pipe is favorably applied for cooling a component of an electronic device such as a CPU, or the like due to the fact that the heat pipe can be easily attached to the component to be cooled, and the heat pipe has a large contact area.

Furthermore, the heat pipe is classified by the manner in which it is attached to the component. The classes are: a top-heat mode heat pipe in which a heat absorbing side of the heat pipe is positioned above a heat dissipating side thereof; and a bottom-heat mode heat type in which the heat absorbing side of the heat pipe is positioned below the heat dissipating side thereof. In the bottom-heat mode heat pipe, a working fluid circulates via gravity. However, in the top-heat mode heat pipe, the working fluid has to be circulated against gravity, thus a capillary phenomenon of a wick is usually introduced in the heat pipe.

The heat pipe includes a hollow space that is prepared within the heat pipe which functions as a passage for working fluid. Heat is transferred by a phase transition between vaporization and condensation as well as movement of the working fluid. The heat pipe has a sealed hollow portion in which the working fluid is phase-transited and moved so as to transfer heat is operated as follows: In the heat absorbing side of the heat pipe, the heat generated by the component to be cooled and conducted through the material forming the container of the heat pipe is absorbed to vaporize the working fluid. The vaporized working fluid is transferred to the heat dissipating side of the heat pipe. In the heat dissipating side of the heat pipe, the vaporized working fluid is condensed to release the latent heat and returned to a fluid phase working fluid. The working fluid returned to a fluid phase circulates back to the heat absorbing side. Thus, the heat is transferred by the phase transition and movement of the working fluid.

In a gravity-type heat pipe, the working fluid returned to a liquid state by the phase transition moves (i.e., circulates) to the heat absorbing side of the heat pipe by gravity. In the top-heat mode heat pipe, the working fluid has to be circulated against gravity, thus a capillary phenomenon of a wick is usually introduced in the heat pipe.

Since a semiconductor device processing high speed signal generates a larger amount of heat, the above-mentioned heat pipe does not fully cool the device. In order to cool the semiconductor device generating large amount of heat, a cooling device in which a thermoelectric cooler, such as a Peltier device, is directly attached to the semiconductor device.

In general, when two kinds of conductors A, B are connected, and a current flows at a constant temperature, the heat is generated or absorbed at a contact point of the conductors A and B, which is known as the Peltier effect. More specifically, p-type thermoelectric semiconductor elements and n-type thermoelectric semiconductor elements are arranged alternately in parallel, and electrodes are placed at both ends of each of the semiconductor elements. Both ends of the respective semiconductor elements and the electrodes are jointed by soldering. Each of the p-type semiconductor elements and the n-type semiconductor elements, which are arranged alternately in parallel, are electrically connected in series through the corresponding electrodes.

An electric circuit which is formed by the electrodes, the p-type semiconductor elements, and the n-type semiconductor elements are electrically insulated from the outside by a pair of electrically insulated substrates which are arranged outside of the respective electrodes. The electrodes and the electrically insulated substrates are jointed by soldering. Thus, the Peltier device has a construction in which the electric circuit formed by the electrodes, the p-type semiconductor elements, and the n-type semiconductor elements are sandwiched by two electrically insulated substrates. By the above-described Peltier device, the heat at one of the electrically insulated substrates is transferred to the other electrically insulated substrate so that the one electrically insulated substrate side is cooled.

Conventionally, for example, as disclosed in Japanese Patent Provisional Publication No. 2004-071969, it is known that the heat from the heat generating source is spread by a heat receiving-spreading device, and the low temperature side of the Peltier device is attached to the heat receiving-spreading device, thus the heat is moved into the Peltier device. A copper heat sink is attached to the high temperature side of the Peltier device.

There are a number of problems in the conventional method in which the lower temperature side of the Peltier device is attached to the heat generating source while the higher temperature side of the Peltier device is attached to the heat sink. When the heat from the heat generating source (for example, CPU) increases, the heat absorbing of the Peltier device (TEC) is not sufficient, such that the thermal resistance of the cooling module rises. More specifically, it becomes difficult to enlarge the temperature difference between the heat sink and the cooling air, resulting in the deterioration of the cooling efficiency. For example, although the required temperature difference for the heat generating source of 120 W is 15 degrees centigrade, the temperature difference obtained by the easily available Peltier device is less than 12 degrees centigrade. It becomes difficult to sufficiently cool the heat generating source by the thermoelectric device, when the heat from the CPU is over 120 W under the condition of a spreading resistance of 0.10 K/W in the heat receiving-spreading device.

In addition, it is generally known that each component of the conventional cooling device is thermally connected by the use of a thermal grease. However, it is difficult to control the thickness of the thermal grease, leading to a large variation of the contact resistance between components. When the thickness of the grease is large, the total thermal resistance of the cooling module becomes high.

Alternatively, the performance and reliability of some electronic devices, such as high power CMOS circuits, can be improved using liquid cooling means such as refrigeration or water rather than air cooling. Non-redundant liquid cooling may help the circuits but the cooling system failure rate is too high for most electronics applications (e.g., servers) without a cooling backup.

Furthermore, the aggregated components of electronic devices may occupy considerable volumes within their respective systems such that redundant liquid cooling is not possible. Because space is at a premium in most electronics applications, particularly as the size of the systems is reduced to keep pace with technological trends, cooling systems may be likewise reduced in size. In addition, higher end modules having increased density of electronic circuitry require redundant or backup cooling means in the event that the primary refrigeration cooling unit fails, but it is often necessary to limit the space needed to employ such a redundant or secondary cooling means.

Finally, the amount of heat that can be dissipated may increase with the size and/or surface area of the heat exchanger. Where space constraints limit the size of a heat exchanger, the efficiency of the heat exchanger may become important. Some devices, for example, might be limited in speed or functionality because higher power components would generate more heat than could be effectively dissipated by a heat exchanger of a given size. It would therefore be beneficial to develop a device that can dissipate heat in electronic devices without increasing the size of the device.

SUMMARY OF THE INVENTION

According to the present invention, there is provided a molecular fan for dissipating heat, the fan having a chemically functionalized molecular fan thin film coating affixed to a surface in need of heat dissipation. A coating assembled with vibration groups for dissipating heat, the coating having a thin film coating affixed to a surface in need of heat dissipation is provided. A molecular fan thin film coating affixed to a surface in need of heat dissipation for dissipating heat is also provided.

BRIEF DESCRIPTION OF THE DRAWINGS

Other advantages of the present invention are readily appreciated as the same becomes better understood by reference to the following detailed description, when considered in connection with the accompanying drawings wherein:

FIGS. 3A and B are graphs showing four sol-gel assembled molecular fans containing different molecular functional groups, wherein FIG. 3A shows Raman intensity of CH vibrational mode versus cooling temperature and FIG. 3B shows Raman spectra of four sol-gel films;

DETAILED DESCRIPTION OF THE INVENTION

Figure 1:
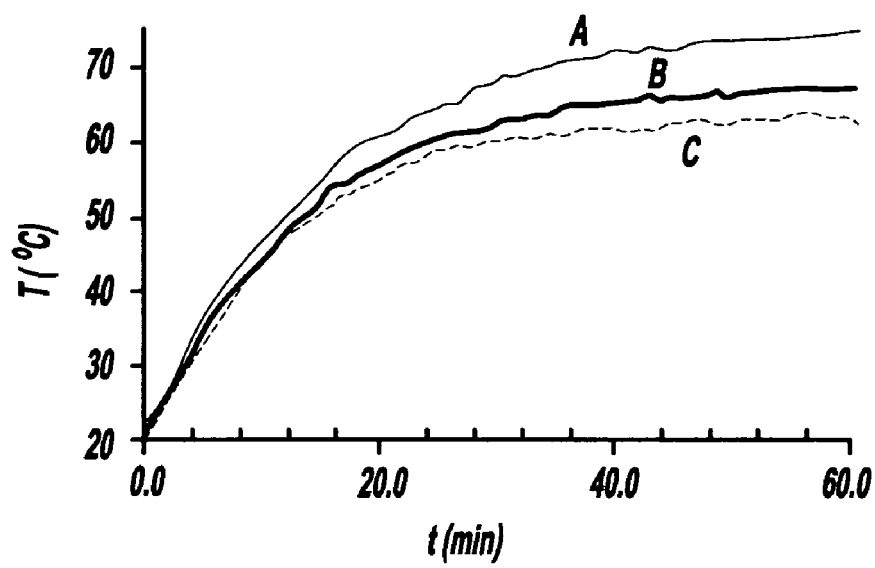
FIG. 1 is a graph showing cooling temperature versus operation time of a molecular fan made of AE (acrylic emulsion) coating with or without the incorporation of conductive carbon black.

Generally, the present invention provides a heat dissipation device for use in electronic devices. More specifically, the present invention provides a molecular fan thin film coating containing nanomaterials for use in heat management for electronic devices, especially nanoelectronic devices.

The molecular fan thin film coating of the present invention has chemically functionalized nanoparticles, such that the coated surface displays an assembly of active molecular vibrational groups, which can act as a molecular cooling fan, termed a "molecular fan." The molecular fan thin film coating is used to enhance emissivity for nanoparticles that are processed in a coated heat-sink or substrate. The molecular fan thin film coating or "molecular fan" be designed and assembled on the surface of a coated substrate by using molecular fan thin film coatings of functionalized nanoparticles.

There are three key ingredients for assembling the molecular fan thin film coating on the surface of a heat-sink or substrate: an acrylic/urethane emulsion, nanoparticles, and functionalized nanomaterials. The emulsions are used to form the molecular fan thin film coating on the heat dissipation surface. The nanoparticles are dispersed in the molecular fan thin film coating to enhance surface area and modify surface morphology. The functionalized nanomaterials are used to assemble the active vibrational groups that can act as a molecular fan.

The molecular fan thin film coating is powered directly from the heat generated by a device, so it requires no external power source. The molecular fan is a thin film coating which contains about $10^{17}$ active molecular functional groups assembled on a 1 $cm^2$ surface area that vibrate and act effectively as a set of $10^{17}$ molecular fans to radiate heat from the heat sink surface. The molecular fan thin film coating is a spaceless nanoassembly of active vibrational groups that do not require additional space as in the traditional mechanical fan. The molecular fan thin film coating is able to aid in cooling beyond microscale and into nanoscale components, and can aid the microprocessor and computer industries in continued miniaturization of computers. The molecular fan thin film coating is independent of many of the variables that limit the ability of mechanical fans to disperse heat such as ambient temperature, air pressure and circulation, and humidity (these conditions are especially critical for aerospace applications).

To process a molecular fan thin film coating, the hybrid formulations can be applied on heat sink or substrates (e.g., aluminum, copper, or steel alloys) by spray coat, dip coat, or draw-bar coat. The coated dry film can be obtained by a forced thermal curing at 80-100° C. for 3-10 minutes. The solid content in the hybrid formulations can be controlled to achieve a dry film thickness of 1-10 μm. The surface morphology of the molecular fan thin film coating can be controlled by the selection of different types of surface modifiers and different size and shape of nanomaterials. A good molecular fan thin film coating should also display good surface adhesion to the substrate, good mechanical property, and good thermal, water, and chemical resistances.

Figure 11:
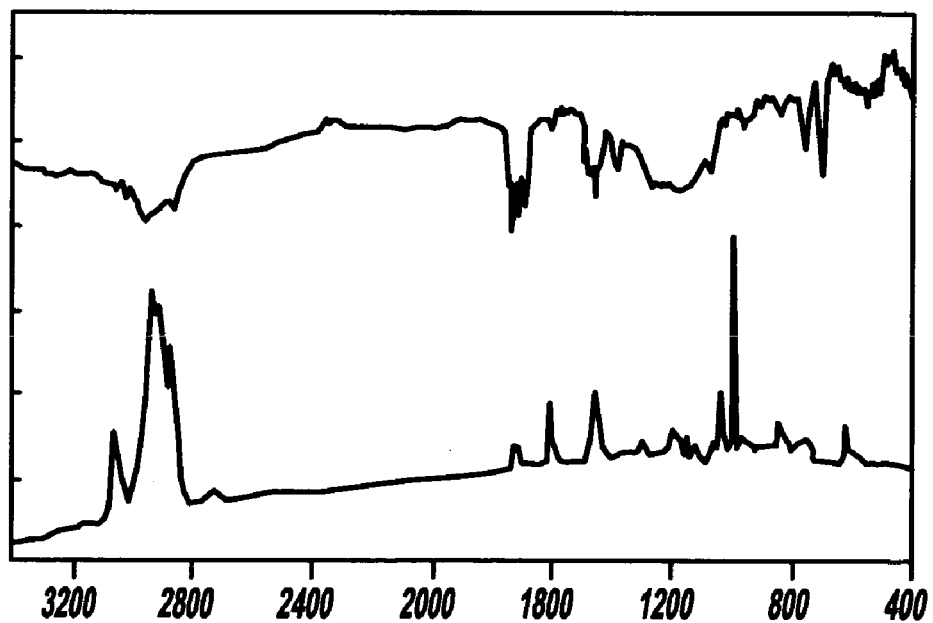
FIG. 11 is a Raman scattering (bottom) and infrared absorption (top) spectra showing vibrational energy levels of a molecular fan coating.
Figure 12A:
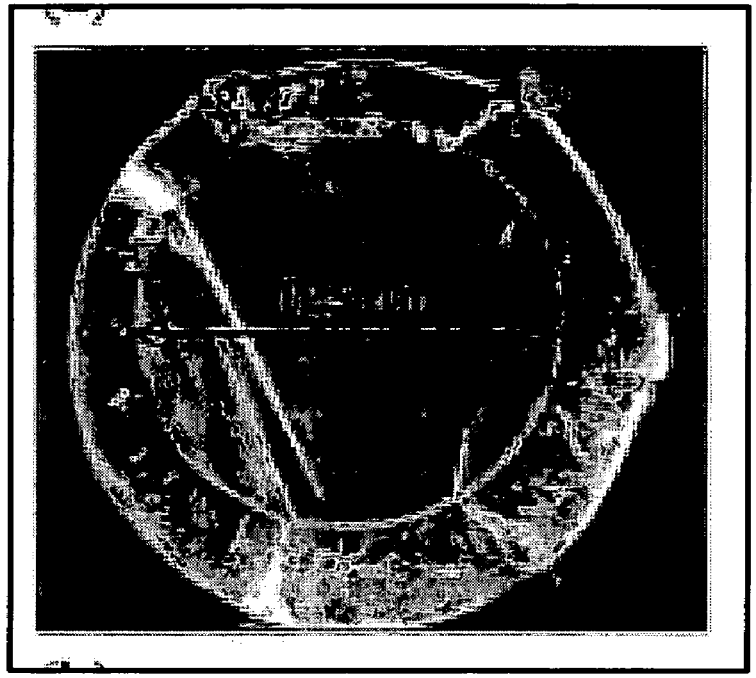
FIGS. 12A-F are an SEM micrograph showing the radially grown nanotubes on the surface of an optical fiber (FIG. 12A), a close-up micrograph of FIG. 12A, and examples of nonplanar, complex surfaces where nanotubes can be grown (FIGS. 12C-F).
Figure 12B:
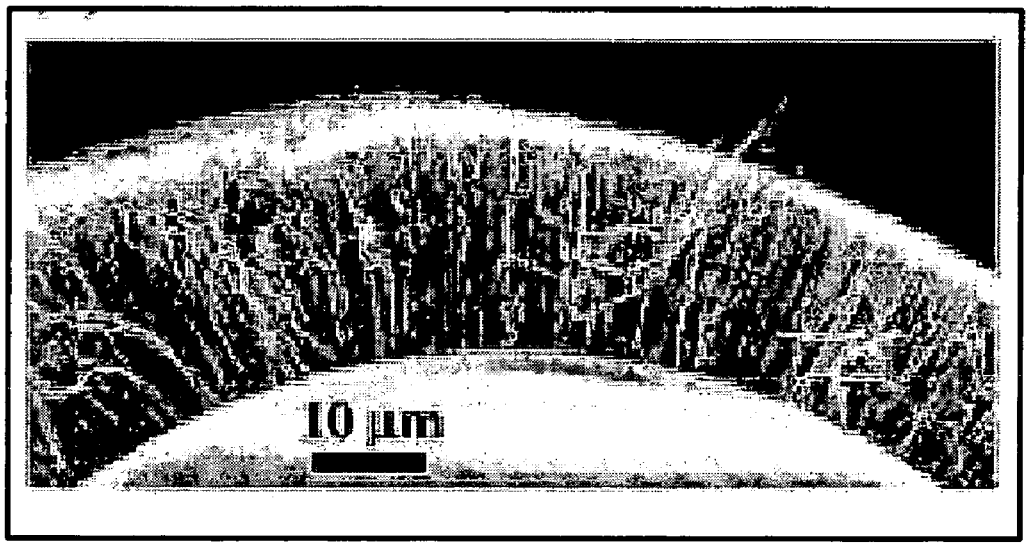
Figure 12C:
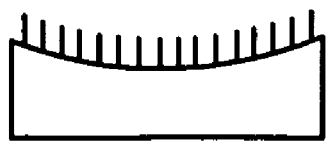
Figure 12D:
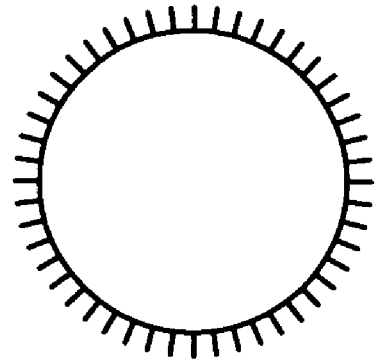
Figure 12E:
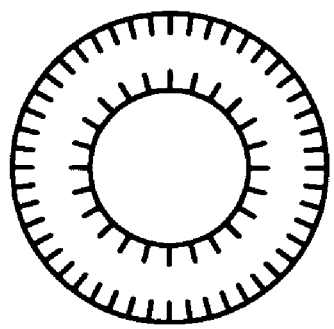
Figure 12F:
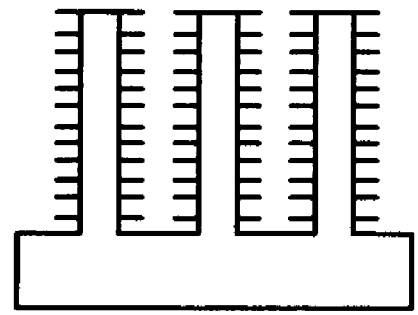

Bonding between two or more atoms (a group) in a molecule acts similar to a spring. The bond vibrates at different frequencies depending on the masses of the two atoms and the strength of the bond, which are analogous to weights on the ends of the spring, and the rigidity of the spring, respectively. Groups that are vibrating rapidly from absorbing heat (from a heat source of an electronic device) can slow down (via both radiative and nonradiative relaxations) by emitting infrared light. The light is equal in energy to the difference between the excited, rapidly vibrating state and the relaxed, slowly vibrating state. The energy of the light that is emitted from the relaxing of a vibration can be measured by taking a spectrum, usually either an infrared absorption spectrum or a Raman scattering spectrum. These spectra typically show many different energy levels (see FIG. 11), because a typical molecule has many different bonds and each bond can vibrate in multiple ways (normal modes of vibration). This information can be used to determine which vibrational groups functionalized in molecular fan thin film coatings have the most potential to emit large amounts of energy per relaxation.

Due to the increased miniaturization and the increasing density of pans inside electronic devices the heat generated inside such devices, i.e., generated by electronic parts, is likely to increase. Currently, electrical components are cooled by conduction (via thermal conductive rubber sheet or thermal conductive transfer tape) of heat to a heat sink, which is cooled by air convection. The warm air is removed from the system using a mechanical fan. Simple convection will not be able to keep up with this increased heat density and devices will need more effective cooling. Such dissipation can be achieved using the molecular fan thin film coatings having functionalized nanoparticles of the present invention. The heat-sink surface coated with the molecular fan thin film coating displays an assembly of active molecular vibrational groups for dissipating heat.

All machines, including computers, cellular phones, and LEDs, produce heat that usually must be dissipated in order to prevent overheating. The heat usually comes from friction (in mechanical systems) or ohmic heating (in electronic systems). In electronic applications, excess heat reduces efficiency and can eventually cause total failure of the device. As technology progresses and silicon chips have more components in a smaller area, the heat produced by the chips per volume will increase. The molecular fan thin film coating more effectively dissipates the heat, which has the effect of lowering the temperature of the system.

A heat sink lowers the heat dissipation barrier mainly by increasing the surface area that is in direct contact with the coolant air. It is well known that when particles change from centimeter size to nanometer size, the surface area and the surface energy of the particles increase by seven orders of magnitude. Therefore, the molecular fan thin film coating of the present invention provides a large increase in emissivity for a coated heat sink since the molecular fan thin film coating contains nanoparticles. Moreover, the introduction of the proposed molecular fan thin film coating can effectively lower the equilibrium temperature of electronic components by ten to fifteen degrees centigrade.

The molecular fan thin film coating can be applied on the heat sink or parts of an electronic device or system. For example, it can be used in electronic devices such as, but not limited to, CPU, GPU, computer, and LED devices and other similar electronic (or nanoelectronic) devices. The molecular fan thin film coating can also be grown on the heat sink (or substrate) surface by using functionalized carbon nanotubes as illustrated in FIG. 12. The plasma induced well-aligned carbon nanotubes can be grown on contoured surfaces and with a growth direction always perpendicular to the local substrate surface. For a molecular fan thin film coating, the functionalized carbon nanotubes can be grown with the desired vibrational groups linked at the top of the tube toward the heat dissipation environment.

The best way to dissipate heat is through radiation cooling. All bodies, warmer than their surroundings, release energy by radiation. The energy is released in the form of photons (light). Around room temperature, the emitted light is in the infrared wavelength, which is why the phenomenon is not observed with human eyesight. At any given temperature and wavelength, there is a maximum amount of radiation that any surface can emit. For bulk materials, if a surface emits this maximum amount of radiation, it is known as a blackbody. There are well known equations such as Planck's Law, which can be used to calculate the amount of radiation emitted as a function of wavelength and temperature. For nanostructures and nanomaterials, they possess a large fraction of surface atoms per unit volume and have a vast surface area and a huge surface energy. Conduction of heat away from the component to the surface of the "molecular fan" thin film coating is still necessary, whether by a heat sink or by simply coating the component itself. Once molecular fan thin film coating molecules (or vibrational groups) have absorbed the energy, they become excited and vibrate rapidly. The excess energy can be released by the emission of a photon of infrared light by the surface molecule. After the emission, the molecule slows down (back in the ground state), and it is ready to repeat the process. The process is independent of many of the variables that limit the ability of mechanical fans to disperse heat, such as ambient temperature, air pressure and circulation, and humidity (these conditions are especially critical for the aerospace applications); however, good conditions still benefit the molecular fan thin film coating, since a portion of thermal energy can still be dispersed by convection.

A major advantage of transferring energy by radiation is that, unlike conduction, which is directly proportional to the temperature difference between the hot and cold regions and convection, which is dependent on diffusion, radiation transfer of energy is proportional to $\Delta T^4$. This means that doubling the temperature difference can have the effect of increasing the power emitted by $2^4$, or sixteen times the energy dissipated at the original temperature. By comparing the dissipation rate under such a temperature change for conduction, which would be double that at the cooler temperature, the radiative rate would be 16/2 or eight times faster than that of conduction. Faster heat dissipation shifts the equilibrium temperature toward the cooler temperature.

The molecular fan thin film coating of the present invention is not only a heat dissipater, but is also a water-based organic (acrylic and/or urethane emulsion)-inorganic (functionalized silanes) hybrid system that contains nanoparticles and functionalized nanomaterials. The co-solvents used are free of hazardous air pollutants (HAPs-free). The nanomaterials of stabilized metals, metal oxides, conductive carbon black and carbon nanotubes (having different particle size and surface area, and different molecular vibrational groups) are dispersed in the molecular fan thin film coating systems.

The nanosize, along with a huge increase in specific surface area, makes nanoparticles attractive for coolant applications. The selected nanomaterials can include metals (such as Au, Ag, Cu, etc), oxides (such as $SiO_2$, $TiO_2$, etc), carbon black and carbon nanotubes. Different shapes and sizes of conductive carbon black powders can be purchased from Akzo Nobel and/or Columbian Chemicals North Bend. High-quality carbon nanotubes, including the functionalized CNTs with —OH, —COOH, and other groups can be purchased from Cheap Tubes, Inc Bayer (Leverkusen, Germany) and/or Nanocyl (Sambreville, Belgium). Both chemical reduction and photoreduction methods can be used to synthesize nanoparticles of Au, Ag, and Cu. The functionalized mercaptosilanes, thioglycolic acid, or other metal chelating agents can be used to stabilize and produce functionalized metal nanoparticles with the specific vibrational groups. The oxides can be synthesized by sol-gel processes using the selected functionalized silanes as precursors. Nano-oxides, such as $SiO_2$ and $TiO_2$, can be used, as well as selected functionalized silanes to cap on and produce the specific molecular groups on the surface of nano-oxides.

Figure 6A:
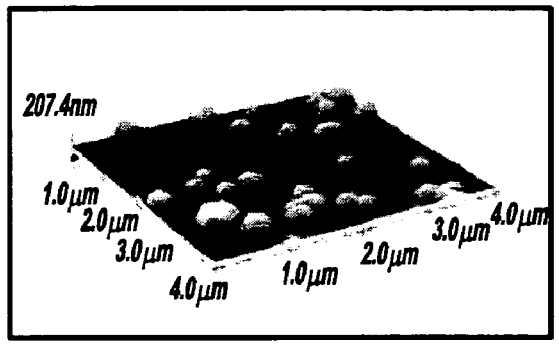
FIGS. 6A and B are photographs showing the AFM angle view image (FIG. 6A) and the top view image (FIG. 6B) of 5 mM $TiO_2$ nanoparticles catalyzed by $HClO_4$ coated on glass.
Figure 6B:
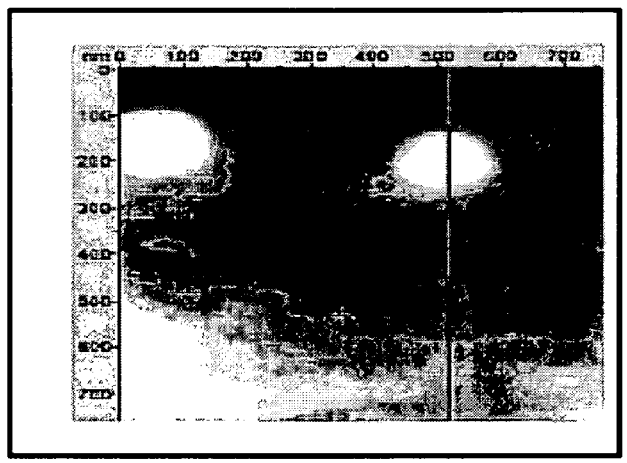

Nanostructures and nanomaterials are intrinsically unstable since they possess a large fraction of surface atoms per unit volume. One of the great challenges in fabrication and processing of nanomaterials is to overcome the surface energy, and to prevent the nanostructures or nanomaterials from growth in size, driven by the reduction of overall surface energy. In general, the electrostatic stabilization, steric stabilization, or a combination of both steric and electric interactions can be employed to prevent the agglomeration of nanomaterials. The nanoparticles of Cu, Ag, and Au can be synthesized by the chemical reduction method and the photoreduction method. The functionalized carbon nanotubes can be obtained from commercial sources. The stabilization of nanomaterials can be investigated by two techniques: (1) encapsulation in a matrix of mercaptosilanes, thioglycolic acid, or other metal chelating agents; or (2) formation of nanocomposites in a 20:1 ratio of $TiO_2$:Au, $TiO_2$:Cu, $TiO_2$:Ag, $SiO_2$:Au, $SiO_2$:Cu and $SiO_2$:Ag. The $SiO_2$ and $TiO_2$ nanoparticles can be synthesized via sol-gel chemical method as recently reported. FIG. 6 shows the AFM pictures of $TiO_2$ nanoparticles.

The $TiO_2$ nanoparticles synthesized via sol-gel chemistry approach are in an anatase form as verified by X-ray diffraction and UV-vis absorption analysis. The particle size of about 12-18 nm is shown to be sensitive to the use of $HClO_4$ or $HNO_3$ as acid catalyst. Gold can be deposited on the $TiO_2$ nanoparticle surface by either cation adsorption or anion adsorption, depending on the pH of the working solution. The $TiO_2$ is an amphoteric oxide with an isoelectric point, $IEP_{TiO2}$=6. Therefore, when the solution pH is higher than $IEP_{TiO2}$ the main surface species is —$O^-$, so the $TiO_2$ surface is negatively charged and gold can be deposited on the $TiO_2$ by cation adsorption. When the solution pH is lower than $IEP_{TiO2}$, the main surface species is —$OH_2^+$, so the $TiO_2$ surface is positively charged. Then gold can be produced on the $TiO_2$ surface by anion adsorption. For example, gold-capped $TiO_2$ can be prepared by adding the desired amount of $HAuCl_4$ solution to the colloidal $TiO_2$ solution made in an acidic medium while stirring vigorously. The $TiO_2$ colloids prepared in acidic media are positively charged. They act as a support to adsorb $[AuCl_4]^+$. The negatively charged $[AuCl_4]^-$ adsorbs strongly on the $TiO_2$ nanoparticle surface. Upon reduction with $NaBH_4$ or photoreduction using a UV light source, stable $TiO_2$/Au nanocomposites are obtained in aqueous solution. Gold actually covers only a small area of the $TiO_2$ surface. Therefore, a large surface area of the $TiO_2$ nanoparticle is still exposed.

Figure 7A:
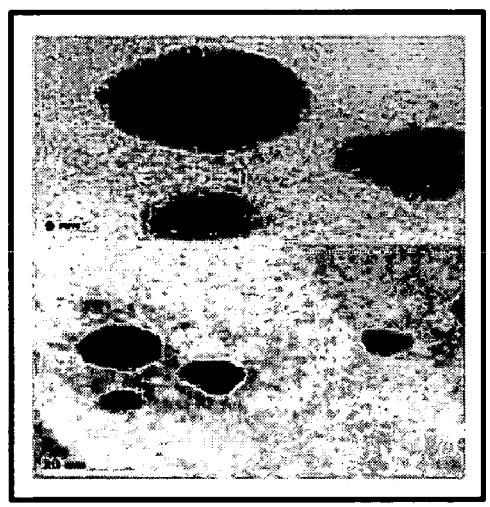
FIGS. 7A and B are TEM images of 4 mM gold-capped nanocomposites (FIG. 7A and B) and $TiO_2$/Au nanocomposites (FIG. 7C and D) at different ratios, 20:1 and 1:1, respectively.
Figure 7B:
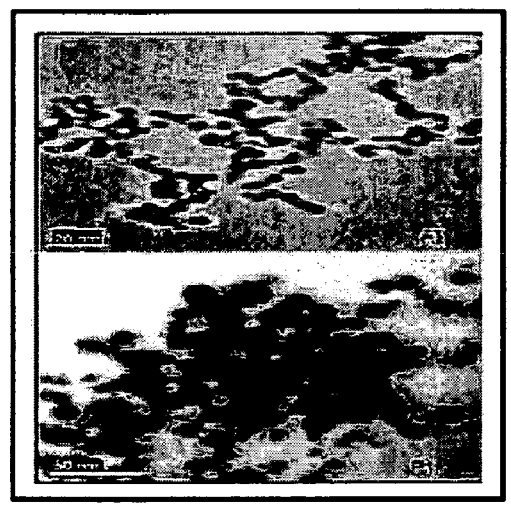

Two different ratios of $[TiO_2]$:$[Au]$ nanocomposite solutions were prepared and characterized. Transmission electron micrographs of two different $[TiO_2]$:$[Au]$ ratios are shown in the right portion of FIG. 7. For the high core: shell ratio (i.e., a $[TiO_2]$:$[Au]$ ratio of 20:1), fairly uniform size gold-capped $TiO_2$ nanocomposites of diameter about 5-10 nm were obtained (FIG. 7A). In contrast, the TEM image for the $[TiO_2]$ $[Au]$ ratio of 1:1 nanocomposites showed a larger size of about 10-20 nm (FIG. 7B). They also tend to close in on each other, indicating the aggregation effect. The fact that the optimal amount of Au was obtained at relatively low loading or at relatively low surface coverage of $TiO_2$ can reflect some recombinative activity of the metallic islands. Without Au-capping, $TiO_2$ solutions showed significant turbidity after several hours at room temperature. In contrast, the $TiO_2$/Au solution remained clear, indicating that gold capped on the $TiO_2$ particles and protected them against precipitation (or agglomeration).

Figure 8A:
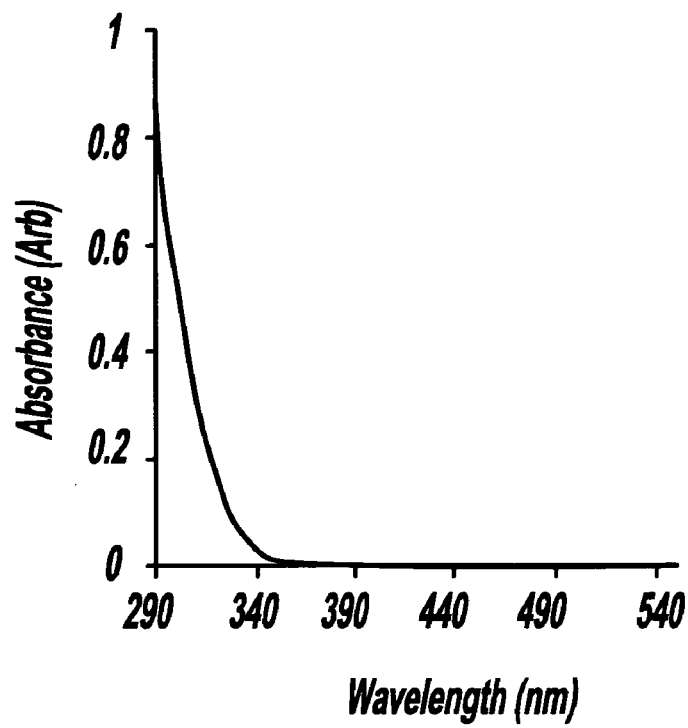
FIGS. 8A and B show UV-vis absorption spectra of, a 5 mM $TiO_2$ nanoparticle solution (FIG. 8A) and an Au-capped-$TiO_2$ composite (FIG. 8B)
Figure 8B:
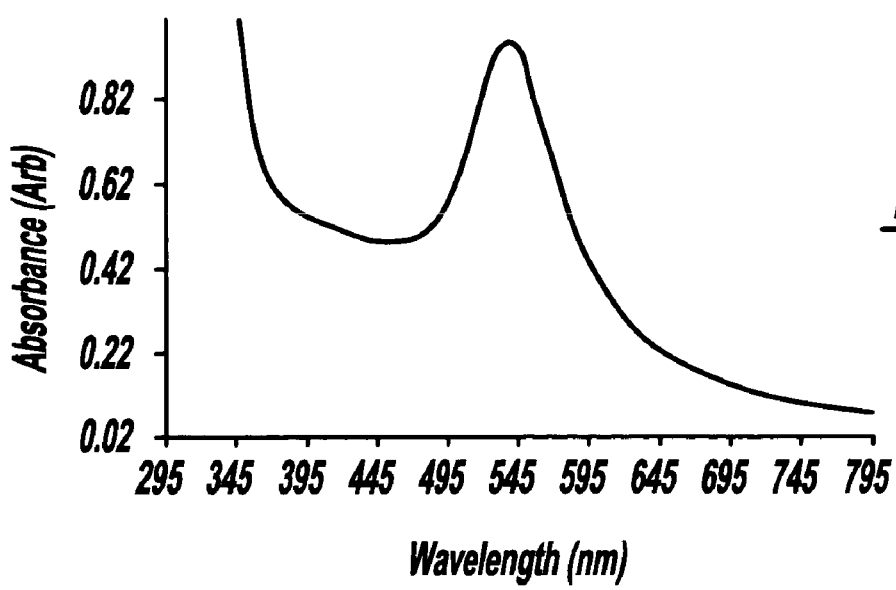
Figure 9A:
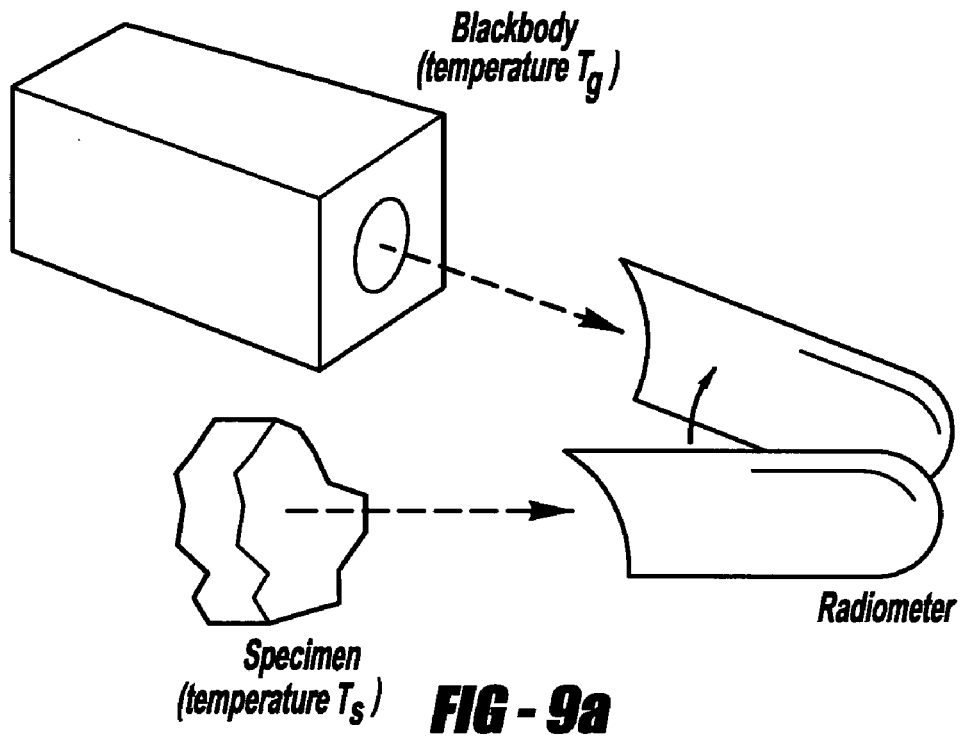
FIGS. 9A and B are diagrams of a radiometric method of emissivity measurement (FIG. 9A) and a radiance spectrum of a specimen alongside a blackbody at the same temperature.
Figure 9B:
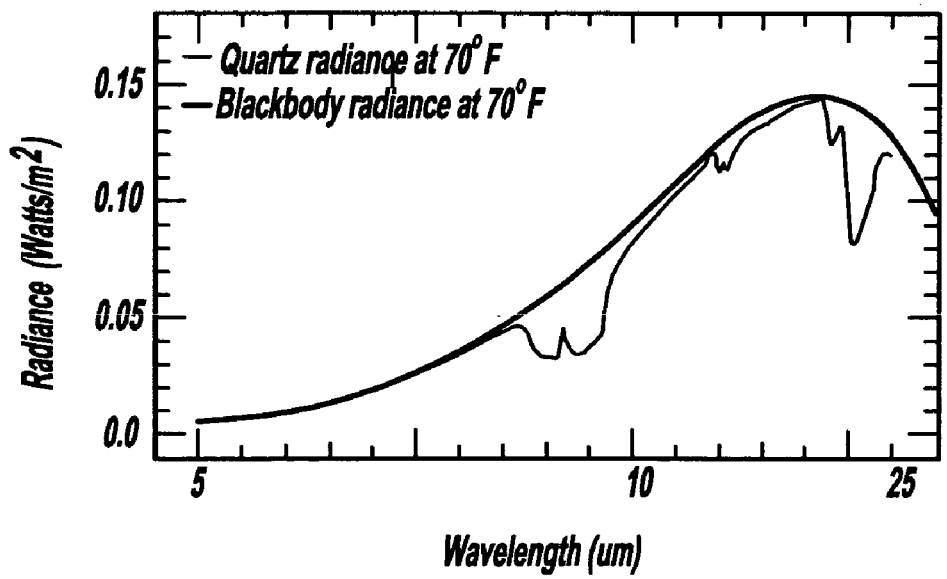
Figure 10:
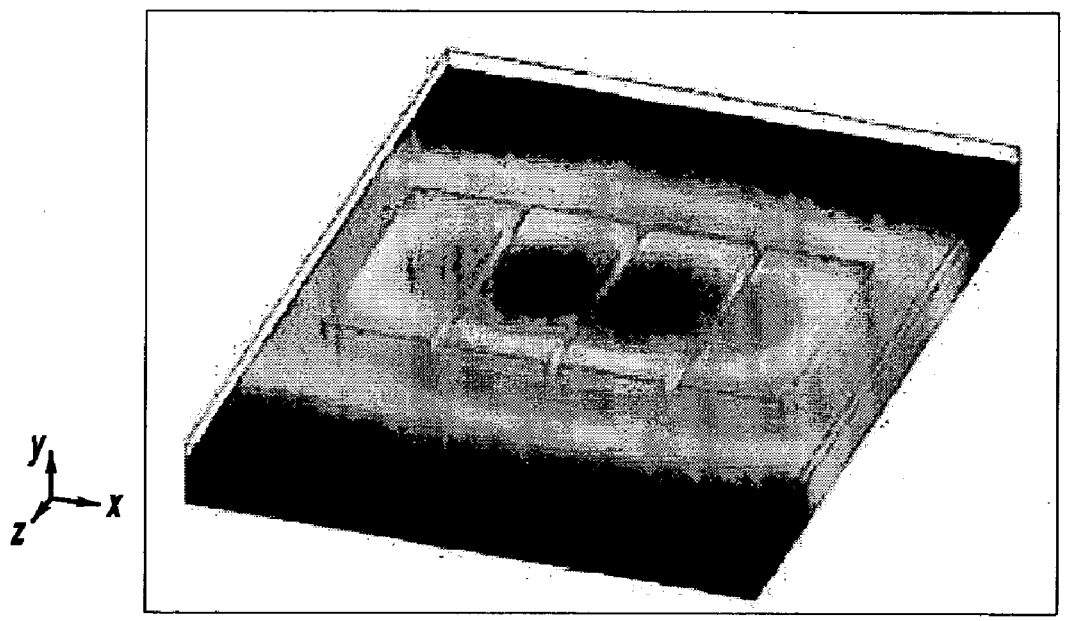
FIG. 10 is an infrared image of a temperature profile at the surface of the extrusion.

Two major structural forms of titanium dioxide can be synthesized: anatase and rutile. Anatase (chains of $TiO_6$ octahedral sharing two edges) has a wider optical band gap of 3.2 eV, while the band gap of rutile (chains of $TiO_6$ octahedral sharing four edges) is 3.0 eV. It is important to develop methods for the selective preparation of $TiO_2$ because anatase and rutile are often formed at the same time during the formation of $TiO_2$. The UV-vis absorption spectrum of a 5 mM $TiO_2$ nanoparticle solution is shown in the left of FIG. 8 and has an absorption edge at ~360 nm (i.e., 3.45 eV), indicating that the $TiO_2$ colloidal solution obtained is anatase and not rutile. The band gap of the prepared $TiO_2$ nanoparticles is at a higher energy than that determined for bulk anatase (3.2 eV). Several different concentrations of $TiO_2$ aqueous suspensions were prepared in an attempt to obtain a $TiO_2$ nanoparticle solution in a higher concentration. The highest concentration that could be reached in an aqueous suspension was 260 mM. At this concentration, the $TiO_2$:Au nanocomposite solution has a loading amount of 7.2% by weight. It is feasible to use this concentration of nanocomposites and disperse them into the organic-inorganic hybrid that contains about 1% by weight of nanomaterials.

The gold-capped $TiO_2$ nanoparticles were prepared by first synthesizing $TiO_2$ nanoparticle suspensions in aqueous solution (stabilized at pH=1.5) and then capping these particles with gold nanocrystallites. In acidic medium, when the noble metal salt ($HAuCl_4$) solution was added into the $TiO_2$ aqueous solution, the $TiO_2$ core acted as a support to adsorb $[AuCl_4]$ ions first. Then, upon reduction with a freshly prepared solution of $NaBH_4$, stable $TiO_2$/Au nanocomposites were obtained and the aqueous solution was wine-red in color. A broad spectral band at 537 nm, which is attributed to the surface plasmon band of gold nanoparticles, appears on the UV-vis absorption spectrum of Au-capped $TiO_2$ suspension as shown in the right portion of FIG. 8.

Organic-inorganic hybrid materials for molecular fan thin film coatings have been extensively investigated. These hybrid materials provide unique properties such as improved physical, mechanical, and thermal properties, as well as gas barrier and photonic properties. The sol-gel technique of alkoxysilanes (including organofunctionalized alkoxysilanes) is one of numerous useful methods to prepare organic-inorganic hybrid materials. The advantage of the sol-gel technique is that the reaction proceeds at ambient temperature to form ceramic materials compared to the traditional methods at high temperature. It is well known that when the inorganic component sizes reach nanometer scale, the hybrid materials often do not comply with estimates from the mixture because of interfacial interactions. However, when the nanosize inorganic ingredient with variable properties is dispersed in a molecular fan thin film coatings formulation, all the unique properties of the molecular fan thin film coating are attributable to this dispersed ingredient.

A water-based organic-inorganic hybrid formulation for molecular fan thin film coatings on heat sink or substrates (e.g., aluminium, copper, and steel alloys) has been initiated as previously discussed. The working hybrid formulations are made of 30-60% water, 18-25% copolymer emulsions (acrylate or urethane), 10-30% functionalized silanes, 15-35% HAP's-free co-solvent, 0.1-2.0% conductive additives (nanosize metal, carbon black, metal oxide, or carbon nanotube), trace amount of surface agent, and trace amount of pH adjusting agent. The copolymer emulsions can be selected to have the finest particle size of 30-60 nm. The functionalized alkoxysilanes can be selected to produce nanosize oxides, to cap on the oxide surface and form molecular vibrational groups and to act as coupling agents for molecular fan thin film coating. The selected additives of nanomaterials can include metal (such as Au, Ag. Cu, etc.) oxides (such as $SiO_2$, $TiO_2$, etc.), carbon black and carbon nanotubes.

The molecular fan thin film coating, for an effective heat management of a device, is based on the principle of blackbody radiation. All objects at temperatures above absolute zero emit electromagnetic radiation as a function of temperature in accordance with the Planck equation.

A blackbody emits total radiant power into a surrounding hemisphere given by $$W_B = \sigma T^4 [W \cdot cm^{-2}] \tag{1}$$

Per unit surface area, where $\sigma$=Stefan-Boltzmann constant and T=Kelvin temperature of the blackbody. Any other body can be characterized by a dimensionless parameter $$\epsilon = W/W_B [\text{dimensionless}] \tag{2}$$

called the total emissivity or "emissivity", the fraction of blackbody power emitted into a surrounding hemisphere. In general, $\epsilon$ depends entirely on the nature and temperature of the emitting surface, regardless of its outside physical environment.

Emissivity is the measure of an object's ability to emit infrared energy. Emitted energy indicates the temperature of the object. Anything that emits energy with a Planck distribution can be called a blackbody, which is thus far named as the standard perfect emitter (bulk materials) with an emissivity of 1.0. The selective emitters are the molecules (e.g., active molecular vibrational groups) of gases, liquids, and solids. The molecules behave like microscopic balls on the ends of molecular springs vibrating when agitated. The agitation arises when light of just the right wavelength hits a particular molecule or by increasing the temperature of the emitters. Once the molecule starts vibrating, the molecule re-radiates the same wavelength of light (i.e., infrared radiation). Every unique molecule (i.e., active functional group) has its own characteristic frequency of vibration. So, unlike a blackbody emitter, molecules (or selective emitters) emit energy that departs from a Planck distribution. One of the ways to describe the infrared energy emitted by molecules (or active vibrational groups) is in terms of radiance (watts of energy per unit of area). With changes in temperature (e.g., a heat-sink coated with molecular fan thin film coating), come changes in radiance. The molecular fan thin film coating, having functionalized molecular functional groups on its surface, of nanoparticles acts as the selective emitter, and displays an enhanced emissivity. The principle behind the heat-dissipating molecular fan thin film coating is the transfer of heat from the coated component to the surroundings. The final step in this process and the one that makes this molecular fan thin film coating technique unique is the emission of infrared radiation by the molecular functional groups via a multiplex vibrational relaxation.

Figure 4:
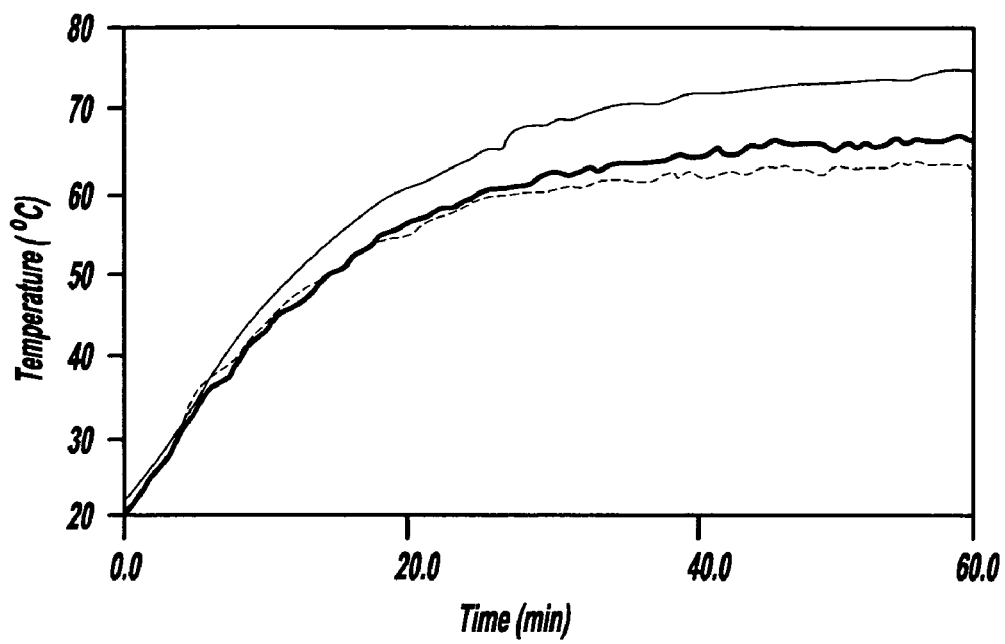
FIG. 4 is a graph showing temperature versus time of the uncoated control that equilibrates at a higher temperature than the coated samples.
Figure 5:
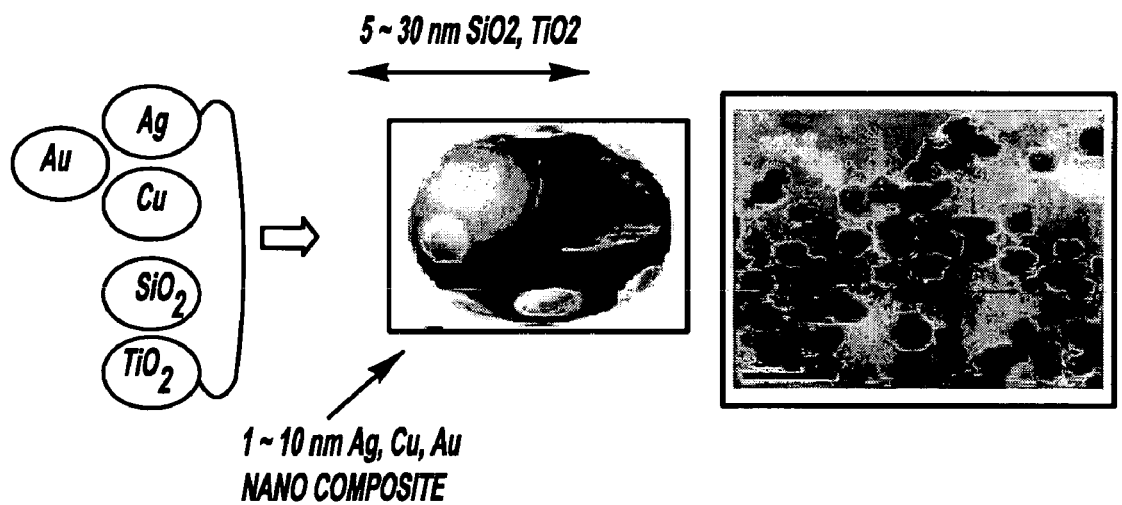
FIG. 5 is a photograph showing the nanoparticles and nanocomposites of the present invention.

To verify that the molecular fan thin film coating functions appropriately, a very preliminary molecular fan thin film coating (containing nanosize acrylic emulsion, nanosize sol-gel solution, and nanosize carbon black powder) was coated on a test aluminum plate with an area of 15 $in^2$. A system was also constructed for heat property testing (measuring temperature as a function of time). An aluminum block was cut to have the same cross-sectional area as the test substrates (panels). The substrate was placed on the aluminum block with good thermal contact between the block and tie panel. The outer part of the panel was coated with the molecular fan thin film coating to be tested. A very small part of the coated side was left uncoated so that a temperature transducer can be placed in good thermal contact on the panel. The aluminum block was used as a heat source and was heated up by use of a 30 W cartridge heater controlled by a variable transformer. The heat was transferred to the test panel, which began to heat up. The temperature was monitored by the temperature transducer and recorded every 30 seconds. The panel increased in temperature rapidly for the first few minutes, increased slowly for a while longer, and eventually (after about twenty minutes) reached equilibrium with the room air and the block, and the temperature remained roughly constant. The potential of the transducer was measured with a multi-meter that is interfaced with a PC to record data. To account for potential problems with ambient temperature fluctuation, an uncoated control panel was run every day that coated panels are measured. FIG. 4 shows the cooling temperature versus operation time of a molecular fan thin film coating made of acrylate organic-inorganic hybrid emulsion, a molecular fan thin film coating with (blue curve) and without (green curve) the incorporation of conductive carbon black, whereas the red curve is the uncoated control aluminum panel. The results indicated that the molecular fan thin film coating (contains nanosize acrylate emulsion and/or nanosize carbon black) on the aluminum panel can effectively lower the equilibrium temperature by nine (without carbon black) to thirteen (with carbon black) degrees centigrade. The cooling efficiency of the molecular fan thin film coating depends on the size and distribution of nanomaterials, the active molecular vibrational modes, heat sink substrates, coating adhesion and coating morphology, film assembly thickness, and the thermal conductive property of the molecular fan thin film coating (for transferring heat from source to sink).

Two different types of molecular fan thin film coatings were used to prepare molecular fan of the present invention; the first is a thin (~1 μm) optically transparent sol-gel based molecular fan thin film coating, and the second is a 5-10 μm thick polymer emulsion. Use of this "molecular fan" coating on one side of a test metal panel lowers the equilibrium temperature of heat sinks by 5-12° C. The efficiency of "molecular fan" coating is shown to depend on the active vibrational modes, heat sink substrates, molecular fan thin film coating adhesion and film assembly thickness, and conductive property of molecular fan thin film coatings. Since, the molecular fan thin film coating is powered directly from the heat generated by a device, it is a powerless heat sink assembly.

The sol-gel molecular fan thin film coatings were formed using silanes, alcohols, water, and potentially, acid catalysts, rheological agents, and/or wetting agents. Formulation was similar to other sol-gel molecular fan thin film coatings that show good adhesion (surface bonding), hardness (crosslinking), and transparency. Sol-gels were made of 20 wt % alkoxide silane (Aldrich, Gelest), 60 wt % ethanol, and 20 wt % water, with small amounts (1 wt % or less) of any other additives. Four different combinations of alkoxide silane precursors were tested, all including 3-glycidoxypropyltrimethoxy silane at 15 wt % of the total formulation. Each of the four sol-gels also contained 5 wt % of one of the following: tetraethylorthosilicate ("TEOS", Aldrich), methyltrimethoxysilane ("MTMOS", Aldrich), plenyltrithoxysilane (Gelest), and cyclohexyltrimethoxysilane (Gelest). The dry film thickness of sol-gel molecular fan thin film coating on aluminum heat-sink panel is preferably less than 1.0 µm.

The organic/inorganic hybrid molecular fan thin film coatings were made using an organic aqueous emulsion in conjunction with water and a small amount of co-solvent to enhance drying/curing. The molecular fan thin film coating solution consisted of 22 wt % organic oligomers (acrvlic/styrene or urethane, Alberdingk, NeoCryl), ~63 wt % water, and ~15 wt % propylene glycol butyl ether ("PnB", Aldrich). A wetting agent was added (less than 1 wt %) to improve the appearance of the molecular fan thin film coating by removing fisheyes and other defects. In some cases, other conductive particles such as carbon black (Akzo Nobel) or titanium oxide (Ishihara Sangvo Kaisha, Ltd.) were used in an attempt to increase the surface conductivity of the assembled molecular fan thin film coating. Some color molecular fans of the urethane molecular fan thin film coating were also made by adding a very small amount (0 05 wt %) of pH indicators or fluorescent dye. Two dry film thicknesses of the organic/inorganic molecular fan thin film coatings were applied on aluminum copper, and cold-rolled steel heat sink coupons; one is about 4.5-5.0 µm and the other is about 9.5-10.5 µm.

The molecular fan thin film coatings showed the ability to cool heat sink (aluminum, copper, steel, or plastic) substrates, with a cooling temperature $\Delta T=7\text{-}12°$ C. for a single-side molecular fan thin film coating. FIG. 1 shows the results of two of these molecular fan thin film coatings, e.g., acrylic emulsion formulations with and without the incorporation of conductive carbon black nanoparticles. Curve 1A shows the cooling temperature of heat sink as time progresses on a bare aluminum panel as control. It heats up from room temperature rapidly for the first twenty minutes and then begins to stabilize as the panel equilibrates with its surroundings; the equilibrated temperature is 74.5° C. Curve 1B shows the same experiment with a heat sink panel that was coated with a 9 5-10.0 µm thin layer of acrylate-based molecular fan thin film coating with no incorporation of conductive carbon black. It follows the same general pattern but equilibrates at a temperature of 67.2° C. that is 7.3° C. cooler than that of the uncoated control panel. Curve 1C shows the results of one of the best molecular fan thin film coatings, an acrylate-based film of 10.0-10.5 µm thick with a small amount (~1 wt %) of added conductive carbon black. The molecular fan thin film coating equilibrates at a temperature of 63.4° C., which is 11.1° C. cooler than the uncoated aluminum control (curve 1A). The results indicate that a conductive molecular fan thin film coating offers a higher cooling efficiency heat sink.

The results of the cooling experiments for molecular fan thin film coating based on acrylic emulsion (AE), urethane emulsion (UE), and sol-gel (SL) molecular fan thin film coatings are summarized in Table 1; the numbers ($\Delta T$ in ° C.) are the differences between the "average equilibrium temperature" (average of last ten temperatures measured) of the molecular fan thin film coating assembled sample and the bare substrate control (Au, Cu, or steel coupon). The top portion of Table 1 displays the results for AE molecular fan thin film coating, i.e., the cooling efficiency is enhanced for molecular fan thin film coating with conductive carbon black as also shown in FIG. 1.

There is a slightly better cooling efficiency for AE molecular fan thin film coating on steel and copper coupons as compared to an aluminum coupon. The middle portion of Table 1 shows the results for UE molecular fan thin film coating. Similar to AE molecular fan thin film coating, UE molecular fan thin film coating with conductive $TiO_2$ particles gives a higher cooling efficiency than that of UE transparent clear fan (without conductive $TiO_2$ particles). The molecular fan thin film coating made of UE molecular fan thin film coating and organic dyes (aniline green, fluorescein, methyl red, bromomethyl blue, and rhodamine B) gives a bright color molecular fan thin film coating and good cooling efficiency. The bottom portion of Table 1 gives the results of sol-gel assembled molecular fan thin film coating. The molecular fan thin film coating is less than 1 µm thick and optically transparent. The cooling efficiency is sensitive to the molecular functional groups assembled, following the order $OH > CH_3 >$ phenyl cyclohexyl. The lighter functional group can vibrate faster upon heating, thus providing a higher efficiency of radiative cooling.

Figure 2:
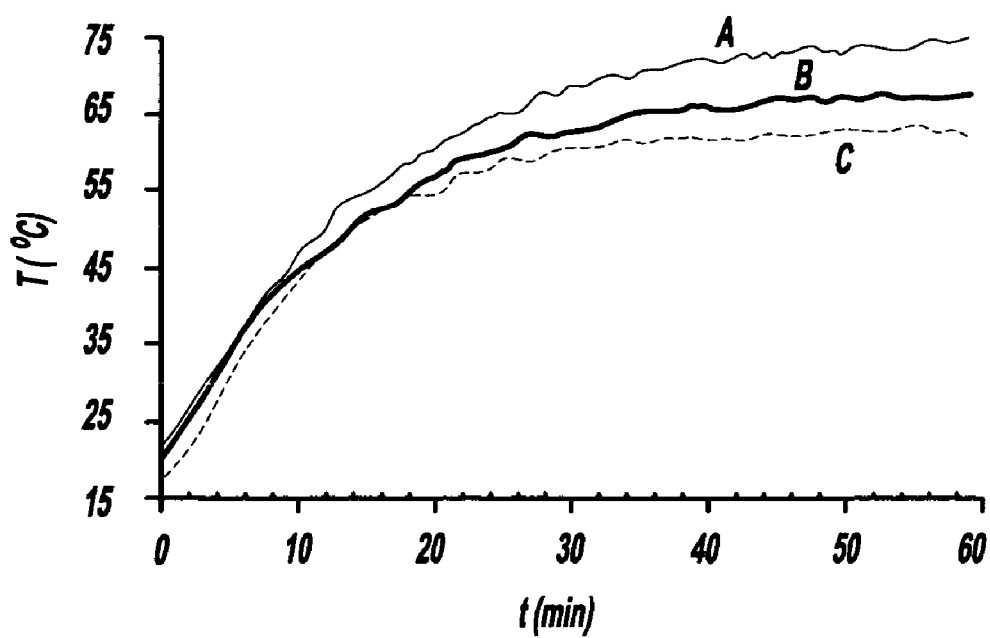
FIG. 2 is a graph showing cooling temperature versus operation time of a molecular fan for two thicknesses of AE coating with or without the incorporation of conductive carbon black.

In almost all cases the thinner molecular fan thin film coatings showed less cooling efficiency than their thicker counterparts, as can be seen in FIG. 2. Curve 2A shows the cooling temperature of heat sink (as operating time progresses) of a bare aluminum panel, with an equilibrated temperature at 74.5° C. Curves 2B and 2C are molecular fans made of two film thickness of AE molecular fan thin film coating with the incorporation of conductive carbon black particles, where Curve 2B has a 4.5 µm thickness and Curve 2C has a 10.0-10.5 µm thickness of molecular fan thin film coatings. The thicker molecular fan thin film coatings offer better coverage of the substrate, filling the microscopic pores and therefore increasing the amount of heat the fan is able to dissipate. Thinner films can also be used, but are able to dissipate less heat.

Figure 3A:
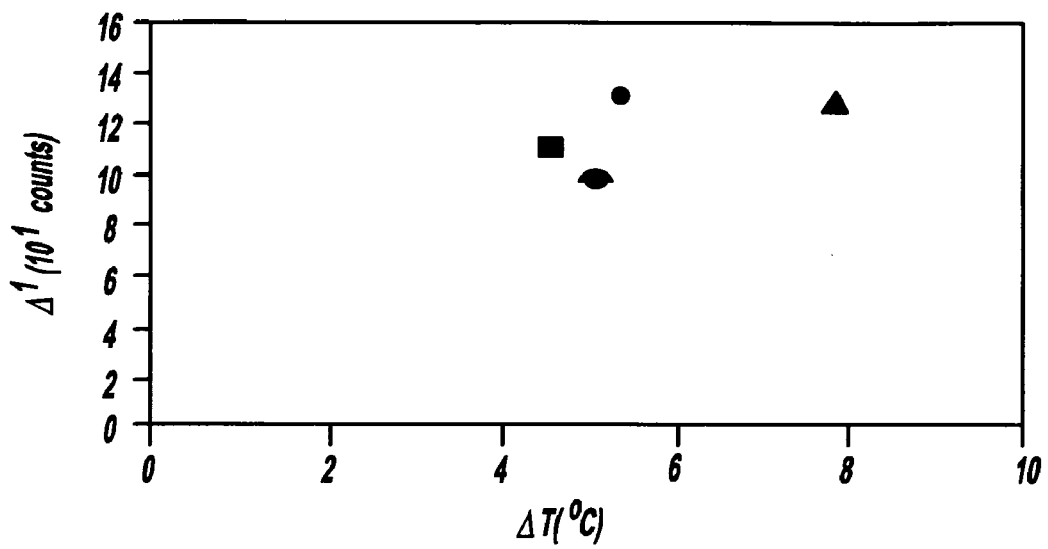
Figure 3B:
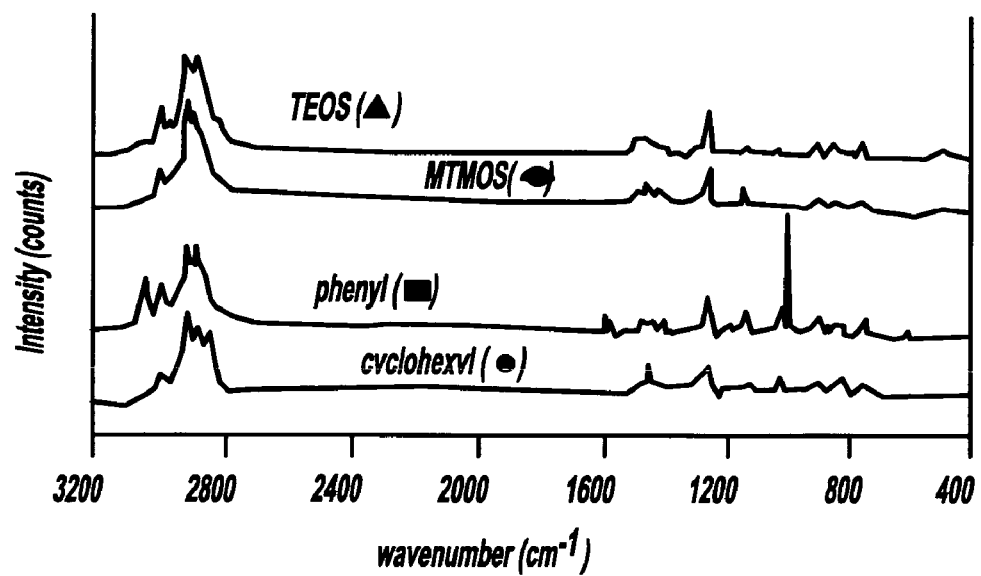

The intention of using organofunctionalized silanes was to introduce groups with different vibrational frequencies into the assembled molecular fan thin film coating to increase infrared emission, thereby releasing more energy over time and increasing cooling power. The radiative cooling ($\Delta T$) is 7.5° C. for tetraethylorthosiliate molecular fan thin film coating, 4.8° C. for methyltrimethoxylsilane, and 4.0° C. for both phenyltriethoxysilane and cyclohexyltrimethoxvsilane molecular fan thin film coatings. The Raman spectra of four sol-gel molecular fan thin film coatings are displayed in the bottom portion of FIG. 3. The most intense (Raman active) vibrations are the carbon-hydrogen stretches at 2930, and 2890 $cm^{-1}$. The top portion of FIG. 3 is a plot of the integrated Raman intensity in the spectral range of 2930-2890 $cm^{-1}$ versus cooling efficiency ($\Delta T$ in ° C.) for four sol-gel molecular fans. The lighter functional group has a higher efficiency of radiative cooling.

A set of molecular fan thin film coatings has been fabricated by using acrylic emulsion, urethane emulsion, and sol-gel molecular fan thin film coatings. The molecular fan has a molecular fan thin film coating layer of less than 1 µm or a thicker layer of 10 µm, and can be an optical transparent layer, a conductive black layer, a conductive silver-white layer or a bright color layer with only single-side molecular fan thin film coating. The cooling efficiency of the molecular fan is excellent at ΔT=10-12 ° C. The molecular fan can be fabricated on metal (such as aluminum, copper, steel, etc) and plastic (such as PC, PMMA, PET, etc.). The molecular fan thin film coating with a lighter functional group seems to offer a higher efficiency of radiative cooling, due to a faster vibration upon heating.

Throughout this application, author and year and patents by number reference various publications, including United States patents. Full citations for the publications are listed below. The disclosures of these publications and patents in their entireties are hereby incorporated by reference into this application in order to more fully describe the state of the art to which this invention pertains.

The invention has been described in an illustrative manner, and it is to be understood that the terminology that has been used is intended to be in the nature of words of description rather than of limitation.

Obviously, many modifications and variations of the present invention are possible in light of the above teachings. It is, therefore, to be understood that within the scope of the appended claims, the invention can be practiced otherwise than as specifically described.

TABLE 1

Molecular fan based on acrylic emulsion (AE), urethane emulsion (UE), and sol-gel (SL) coatings

| | ΔT in ° C. | | | |
|---|---|---|---|---|
| | AE | | AE with conductive carbon black | |
| | 4.5-5.0 μm | 9.5-10.0 μm | 4.5 μm | 10.0-10.5 μm |
| Al coupon | 6.6 | 7.3 | 7.5 | 11.1 |
| Cu coupon | — | — | 9.6 | — |
| Steel coupon | — | — | 11.8 | 11.8 |

| | UE on Al coupon (dry film thickness, DFT = 4.5-5.0 μm) |
|---|---|
| UE transparent (clear fan) | 7.7 |
| UE with conductive TiO$_2$ (silver-white fan) | 9.4 |
| UE with aniline green (blue-green fan) | 8.3 |
| UE with fluorescein (light green fan) | 8.1 |
| UE with methyl red (orange red fan) | 7.1 |
| UE with bromomethyl blue (yellow fan) | 7.8 |
| UE with rhodamine B (pink fan) | 6.7 |

| | SL on Al coupon (transparent, DFT less than 1.0 μm) |
|---|---|
| Tetraethylorthosilicate | 7.5 |
| Methyltrimethoxysilane | 4.8 |
| Phenyltriethoxysilane | 4.0 |
| Cyclohexyltrimethoxysilane | 4.0 |

REFERENCES

Chen, Y. C., Zwolak. M., and Di Ventra, M., "Local Heating in Nanoscale Conductors," *Nano Letters,* 2003, 3, 1691-1694.

Planck M *The Theory of Heat Radiation*", Dove N.Y., 1969.

Shih, H D, Jona, F, Jepsen D. W., and Marcus, P. M., "Atomic Underlayer Formation During the Reaction of Ti {0001} With. Nitrogen," *Surface Sci,* 1976, 60, 445-465.

Roig, J., Flores, D., Urresti, J, Hidaigo, S, and Rebollo, J., "Modeling of non-uniform heat generation in LDMOS transistors," *Solid-State Electronics,* 2005, 49, 77-84.

Campbell L A, Ellsworth Jr, M J Ivengar, M., Simons, R. E., and Chu, R. C, "Experimental Investigation of the Heat Transfer Performance of Arrays of RoundJets with Sharp-Edged Orifices and Peripheral Effluent; Convective Behavior of Water on a Heated Silicon Surface," *Proceedings of the* 2005 *ASME Summer Heat Transfer Conference,* San Francisco, Calif., USA, Jul. 17-22, 2005.

Lee S "Optimum Design and Selection of Heat Sinks" *Proceeding of the* 11*th IEEE Semi-Them, Symposium,* pp. 48-54, 1995.

Ruckenstein, E, "Transfer Coefficients in Complex Cases by Scaling the Transport Equations," *Ind. Eng. Chem. Res.* 2003, 42, 2525-2529.

Churchill, S W, "The Conceptual Analysis of Turbulent Flow and Convection," *Chem and Eng Processing,* 1999, 38, 427-439.

Bessaih, R., and Kadja. M., "Turbulent natural convection cooling of electronic components mounted on a vertical channel," *Applied Thermal Engineering,* 2000, 20 141-154.

Sathe, S, B., and Tong, T. W., "Comparison of Four Insulation Schemes for Reduction of Natural Convective Heat Transfer in Rectangular Enclosures," *International Communications in Heat and Mass Transfer,* 1989, 16, 795-802.

Tan F L, and Tso, C P, "Cooling of mobile electronic devices using phase change materials," *Applied Thermal Engineering.* 2004, 24, 159-169.

Fan, J R, Hu, G L, Yao, J, and Cen, K F, "A Two-Dimensional Mathematical Model of Liquid-Feed Direct Methanol Fuel Cells," *Energy & Fuels,* 2002 16, 1591-1598.

Schill A W, and El-Sayed, M A, "Wavelength-Dependent Hot Electron Relaxation in PVP Capped CdS/HgS/CdS Quantum Dot Quantum Well Nanocrystals" *J. Phys. Chem. B,* 2004, 108, 13619-13625.

Tantolin, C., Godet, C., and Zaghdoudi, M. C., "Heat Pipe Thermal Behavior from Frozen Start-up," *PCIM* 2000, Nuremberg, Jun. 5-9, 2000, pp 355-360.

Sizemore, C A Recchia M L, Kim T, and Lin, C T, "Molecular Fan: Heat Sink for Nanoelectronic Devices," *Technical Proceedings of the* 2005 *NTSI Nanotechnology Conference and Trade Show* (Chapter 5 Surfaces and Films), 2005, 2, 339-342.

Turkevich, J, Hillier, J and Stevenson, P C, "A Study of the Nucleation and Growth Processes in the Synthesis of Colloidal Gold,". *Discuss. Faraday Soc.,* 1951, 11, 55-75.

G. Fu, G., Vary. P. S., and Lin, C. T., "Anatase TiO$_2$ Nanocomposites for Antimicrobial Coatings," *J Phys. Chem. B.,* 2005, 109, 8889-8898.

Zanella, R., Giorgio, S, Henry, R. C., and Louis, C., "Alternative Methods of Preparation of Gold Nanoparticles Supported on TiO$_2$," *J Phys. Chem B,* 2002, 106. 7634-7642.

Linsebigler, A L, Lu, G, and Yates, J T, "Photocatalysis on TiO$_2$ Surfaces: Principles, Mechanisms, and Selected Results," *Chem Rev,* 1995, 95, 735-738.

Mogyorosi, K., Dekany, I., and Fendler, H. J., "Preparation and Characterization of Clay Mineral Intercalated Titanium Dioxide Nanoparticles," *Langmuir,* 2003, 19 2938-2946.

Subranmanian, V, Wolf, E E, and Kamat, V P., "Influences of Metal/Metal ion Concentration of the Photocatalytic Activity of TiO$_2$—Au Composite Nanoparticles," *Langmuir;* 2003, 19, 469-474.

Bower, C, Zhu, W, Jin, S and Zhou, O., "Plasma-induced Alignment of Carbon Nanotubes", *AppL. Phys. Lett.,* 2000, 77, 830-832.

Orel, B.; Gunde, M. K.; Kramer, A. "Radiative Cooling Efficiency of White Pigmented Paints," *Solar Energy,* 1993, 50, 477-482.

Japanese Patent Provisional Publication No. 2004-071969

What is claimed is:

1. A molecular fan for dissipating heat, said fan comprising a chemically functionalized molecular fan thin film coating with a thickness of 1-10 μm affixed to a heat sink surface in need of heat dissipation, said molecular fan thin film coating comprising an emulsion, nanoparticles, and functionalized nanomaterials capable of assembling active vibrational groups that emit infrared radiation within said coating, and made using hazardous air pollutants-free (HAPs-free) co-solvents.

2. The fan according to claim 1, wherein said emulsion is an emulsion capable of forming a thin film coating on the heat sink surface.

3. The fan according to claim 2, wherein said emulsion is a green emulsion.

4. The fan according to claim 3, wherein said emulsion is selected from the group consisting essentially of an acrylic emulsion, a urethane emulsion, and organic-inorganic hybrid systems.

5. The fan according to claim 1, wherein said nanoparticles are nanoparticles capable of enhancing surface area and modifying surface morphology.

6. The fan according to claim 5, wherein said nanoparticles are selected from the group consisting essentially of metals, oxides, carbon black, and carbon nanotubes.

7. The fan according to claim 6, wherein said metals are selected from the group consisting essentially of silver, gold, and copper.

8. The fan according to claim 6, wherein said oxides are selected from the group consisting essentially of $SiO_2$ and $TiO_2$.

9. The fan according to claim 1, wherein said functionalized nanomaterials are functionalized alkoxysilanes and functionalized carbon nanotubes.

10. A coating for dissipating heat comprising a thin film coating with a thickness of 1-10 μm affixed to a heat sink surface in need of heat dissipation, said thin film coating comprising an emulsion, nanoparticles, and functionalized nanomaterials capable of assembling active vibrational groups that emit infrared radiation within said coating, and made using hazardous air pollutants-free (HAPs-free) co-solvents.

11. The coating according to claim 10, wherein said emulsion is an emulsion capable of forming a thin film coating on the heat sink surface.

12. The coating according to claim 11, wherein said emulsion is a green emulsion.

13. The coating according to claim 12, wherein said emulsion is selected from the group consisting essentially of an acrylic emulsion, a urethane emulsion, and organic-inorganic hybrid systems.

14. The coating according to claim 10, wherein said nanoparticles are nanoparticles capable of enhancing surface area and modify surface morphology.

15. The coating according to claim 14, wherein said nanoparticles are selected from the group consisting essentially of metals, oxides, carbon black, and carbon nanotubes.

16. The coating according to claim 15, wherein said metals are selected from the group consisting essentially of silver, gold, and copper.

17. The coating according to claim 15, wherein said oxides are selected from the group consisting essentially of $SiO_2$ and $TiO_2$.

18. The coating according to claim 10, wherein said functionalized nanomaterials are functionalized alkoxysilanes and functionalized carbon nanotubes.

19. A molecular fan thin film coating affixed to a heat sink surface in need of heat dissipation for dissipating heat, said molecular fan thin film coating having a thickness of 1-10 μm and comprising an emulsion, nanoparticles, and functionalized nanomaterials capable of assembling active vibrational groups that emit infrared radiation within said coating, and made using hazardous air pollutants-free (HAPs-free) co-solvents.

* * * * *

UNITED STATES PATENT AND TRADEMARK OFFICE
CERTIFICATE OF CORRECTION

PATENT NO. : 7,931,969 B2
APPLICATION NO. : 11/331492
DATED : April 26, 2011
INVENTOR(S) : Chhiu-Tsu Lin Page 1 of 1

It is certified that error appears in the above-identified patent and that said Letters Patent is hereby corrected as shown below:

In the claims:

Col. 17, line 41, please insert a -- , -- after "nanomaterials".
Col. 18, line 5, please insert a -- , -- after "nanomaterials".
Col. 18, line 37, please insert a -- , -- after "nanomaterials".

Signed and Sealed this
Twenty-fourth Day of September, 2013

Teresa Stanek Rea
*Deputy Director of the United States Patent and Trademark Office*